United States Patent
Sirtori et al.

(12)

(10) Patent No.: US 6,190,734 B1
(45) Date of Patent: *Feb. 20, 2001

(54) PROTECTIVE TREATMENT OF A ZINC OR A ZINC ALLOY SURFACE

(75) Inventors: Vittorio Sirtori; Franco Zambon; Pietro Luigi Cavallotti; Luca Magagnin, all of Milan (IT)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/159,238

(22) Filed: Sep. 23, 1998

(30) Foreign Application Priority Data

Apr. 17, 1998 (GB) .................................. 9808147

(51) Int. Cl.⁷ ....................................... B05D 3/10
(52) U.S. Cl. ......................... 427/337; 427/96; 427/406; 427/435; 148/248
(58) Field of Search .............. 427/96, 333, 337, 427/377, 406, 435; 428/901; 439/55, 83; 148/244, 248, 533; 228/203, 208, 262.61

(56) References Cited

U.S. PATENT DOCUMENTS

| | | | |
|---|---|---|---|
| 3,767,381 | * 10/1973 | Bielefeldt | ................................ 75/63 |
| 3,933,531 | 1/1976 | Sawa et al. . | |
| 4,283,460 | * 8/1981 | Shemenski, Sr. | .................... 428/389 |
| 4,440,721 | 4/1984 | Wilson et al. . | |
| 4,529,487 | * 7/1985 | Hsu et al. | ........................... 204/37.1 |
| 4,683,071 | 7/1987 | Regenass et al. . | |
| 4,761,473 | 8/1988 | Treybig et al. . | |
| 5,401,337 | * 3/1995 | Carlson et al. | ....................... 148/257 |
| 5,435,860 | 7/1995 | Maki et al. . | |
| 5,567,534 | * 10/1996 | Yano et al. | ........................... 428/607 |
| 5,639,515 | * 6/1997 | Kanda et al. | ....................... 427/327 |

FOREIGN PATENT DOCUMENTS

| | | | |
|---|---|---|---|
| 0 428 260 A2 | 5/1991 | (EP) | ............................... C23F/11/14 |
| 0 643 154 A2 | 3/1995 | (EP) | ............................... C23F/11/14 |
| 0 739 965 A1 | 10/1996 | (EP) | ............................... C09K/5/00 |
| 2138837 | 10/1984 | (GB) | ............................... C09K/3/18 |
| 2312391 | 10/1997 | (GB) | ............................... B23K/1/20 |
| 6-085417 | * 3/1994 | (JP) . | |
| 7-173675 | * 7/1995 | (JP) . | |

OTHER PUBLICATIONS

WPI Accession No. 85–071976/12 & JP 60026673 A (Shikoku), 1985.

* cited by examiner

*Primary Examiner*—Shrive Beck
*Assistant Examiner*—Michael Barr
(74) *Attorney, Agent, or Firm*—Steven Capella

(57) ABSTRACT

A method and a bath for protecting a Zn or Zn alloy surface against the corrosion and oxidation and for improving the wettability characteristics of a Zn or Zn alloy surface with a Sn solder alloy. The method is particularly useful in the manufacture of electronic components, when the deposition of a thin layer of Zn or Zn alloy is needed before the deposition of the Sn alloy (particularly Pb free) to improve the solderability characteristics of the Cu surface.

5 Claims, No Drawings

PROTECTIVE TREATMENT OF A ZINC OR A ZINC ALLOY SURFACE

TECHNICAL FIELD

The present invention relates to a method for treating a zinc or a zinc alloy surface for protection against corrosion and oxidation.

BACKGROUND OF THE INVENTION

Zinc is widely used in many different fields (e.g. building industry, domestic appliances, mechanics), especially as a coating for its protection properties: zinc acts as a sacrificial anode. However its use is somehow limited by the inclination to the oxidation and corrosion when exposed to air. For the same reason zinc never found a wide diffusion in electronic applications.

In the electronic field, more specifically in the manufacture of electronic modules, patent application EP-A-97300569.7 discloses a method of pretreating a copper surface by applying a thin film of zinc with the purpose of improving the solder property of tin based solder alloys. Zn is believed to be usually harmful for a soldering process if present in a Sn alloy. The result is that the wettability of the alloy is decreased, because Zn is highly reactive with Oxygen and during reflow produces Zn oxide which compromises the connection between the pins of the electronic component and the solder alloy and prevents solder coalescence. However if a thin Zn layer is deposited onto the Cu substrate before depositing the solder alloy, during the reflow it does not come in contact with oxygen and it does not oxidize. A very thin Zn layer is able to significantly improve the mechanical and electrical properties of the solder layer which is hundreds of time thicker. This effect seems to be mainly due to the ternary alloy CuZnSn which is formed near the surface of the Cu substrate. Studying the thermodynamic behaviour, it is possible to see that the Sn and Zn attractive interaction for Cu atoms is in some way increased by their mutual repulsion, influencing the valence band, through possible orbital hybridization, and increasing the ternary alloy stability. The increase of the number of states at the Fermi energy level could account for a possible increase of the interface electrical properties.

Another important effect of the Zn pretreatment of the Cu substrate is related to the aging behaviour of the coating. Artificial aging experiments have shown a good behaviour of the ternary alloy CuZnSn obtained with the above method, due to the high deposit uniformity if compared with other Pb free solder methods.

According to the method described in EP-A-97300569.7 the zinc film is deposited on the Cu surface by electro deposition. The electro-deposition process has the drawback of requiring electrical connection to the area where the treatment is needed and this can cause some problems in many case. Patent application GB-9800624.0 discloses a method for an electroless deposition of Zn—Sn layer on a metallic surface. This film improves the solderabilty properties of a Sn alloy and it is particularly useful in the manufacturing of electronic packages, when metallic components with Cu contacts must be soldered to a substrate having Cu circuit traces by means of a Sn based alloy (e.g. Sn—Bi alloy).

However, the zinc coating described above presents the drawback of being very vulnerable to the atmospheric agents. For this reason the solder alloy must be immediately deposited on the zinc film in order to avoid the corrosion and the oxidation caused by its exposure to the air.

It is an object of the present invention to provide a technique which alleviates the above drawbacks of the prior art.

SUMMARY OF THE INVENTION

According to the present invention, we provide an alcoholic solution for protecting a zinc or a zinc alloy surface containing a compound of the azole family in the quantity of 0.005 to 3 mol/litre, and preferably 1 mol/L.

Furthermore, according to the present invention, we provide a method for protecting a Zn or Zn alloy surface comprising the step of: immersing the Zn or Zn alloy surface in the alcoholic solution containing a compound of the azole family in the quantity of 0.005 to 3 mol/litre.

DETAILED DESCRIPTION OF THE PREFERRED EMBODIMENT

According to a preferred embodiment of the present invention, a zinc or zinc alloy surface is immersed in an organic solution containing an azole compound. Zinc forms a stable complex with azole, which protects the zinc or zinc alloy surface against oxidation, while providing good wettability with respect to tin (Sn) solder alloy. The last feature is particularly useful in the field of electronic components as described above. The concentration of the azole in the organic solution should be in the following range:

azole 0.005–3 mol/litre

According to a preferred embodiment of the present invention the bath solution is prepared by dissolving the azole in alcohol. More specifically, as an example of preparation according to a preferred embodiment, 10 g of benzotriazole ($C_6H_5N_3$) are dissolved in 100 ml of isopropanol ($C_3H_8O$). For increasing the wettability of the bath solution a surfactant can be added. The surfactant can be added to the solution at about 0.1–0.3 vol. %. According to a preferred embodiment of the present invention 0.1% in volume of surfactant is added to the above described solution. According to a preferred embodiment a commercially available product, SANDOPAN ECO produced by Clariant, is used, but similar product can work also well.

The zinc or zinc alloy surface is immersed in the above described solution for about 1 minute at a temperature of about 40° C. Then it is rinsed (e.g. in isopropanol) and dried in nitrogen or air atmosphere.

The zinc or zinc alloy surface, treated with the method according to the present invention, shows a decreased oxidation when exposed to air. This improvement is particularly appreciated after heating. This is important in the electronic applications, because the modules usually undergo heating reflowing cycles during manufacturing.

Another improvement noticed on the zinc and zinc alloy surfaces after treatment with the solution bath described above is the increased resistance to corrosion. To show the improvements in the corrosion protection of a zinc or zinc alloy surface, three different samples have been tested: a zinc sheet, a copper substrate covered by a zinc layer deposited according to the method of patent application EP-A-97300569.7, a copper substrate with a zinc-tin layer electrolessly deposited with a method according to patent application GB-9800624.0. The three samples have been immersed in a de-aerated synthetic marine salt acid solution (sodium chloride 35 g/l, de-aerated by bubbling nitrogen for 1 hour before the test and buffered at pH 4.5 with the addition of boric acid ($H_3BO_3$) 20 g/l, room temperature); then potentiodynamic runs have been applied, starting from cathodic conditions and increasing the potential at a rate of 1 mV/s. Each surface has been tested with and without the protection treatment according to the present invention. The results are as follows:

| SAMPLE | Corrosion Current | Corrosion potential (Vs Ag/AgCl) |
| --- | --- | --- |
| Zn without pretreatment | 317 μ A/cm2 | −1030 mV |
| Zn with pretreatment | 192 μ A/cm2 | −930 mV |
| Cu + Zn without pretreatment | 175 μ A/cm2 | −1010 mV |
| Cu + Zn with pretreatment | 82 μ A/cm2 | −1010 mV |
| Cu + Zn—Sn without pretreatment | 15 μ A/cm2 | −197 mV |
| Cu + Zn—Sn with pretreatment | 1 μ A/cm2 | −271 mV |

Those skilled in the art will appreciate that the above table shows a substantial improvement in the corrosion behaviour of the zinc or zinc alloy samples after treatment with the above described method: while the corrosion potential (i.e. the value of potential where anodic and cathodic currents get the same value) remains more or less the same, the speed at which the zinc or zinc alloy surface is corroded is sensibly decreased as shown by the corrosion current in the above table.

A further improvement obtained with the protective method according to a preferred embodiment of the present invention is the increased wettability of the zinc or zinc alloy surface with respect to tin based solder alloy. This result is very important in the manufacturing of electronic modules, when a component must be soldered using a tin alloy onto a zinc or zinc alloy surface as in the case described in the above mentioned patent application GB-9800624.0. A drawback of the method of patent application GB-9800624.0 was the limited wettability of the zinc-tin layer with respect to the tin solder alloy. With the treatment of present invention a wettability comparable with that of a copper surface is obtained.

What is claimed is:

1. A method for protecting a metal surface, said metal consisting essentially of Zn or a mixture of Sn and Zn, comprising the steps of:

immersing the metal surface in an alcoholic solution consisting essentially of an alcohol, a compound of the azole family in the quantity of 0.005 to 3 mol/liter and about 0.1 to 0.3 vol. % surfactant, rinsing the metal surface with isopropanol; and drying the rinsed metal surface in a nitrogen atmosphere.

2. The method of claim 1 wherein the step of immersing the metal surface in the alcoholic solution lasts about 1 min and the alcoholic solution has a temperature of about 40° C.

3. The method of claim 1 wherein said alcohol is isopropanol.

4. A method for protecting a metal surface, said metal consisting essentially of Zn or a mixture of Sn and Zn, comprising the step of:

immersing the metal surface in an alcoholic solution consisting essentially of an alcohol, a compound of the azole family in the quantity of about 1 mol/liter and about 0.1 to 0.3 vol. % surfactant.

5. The method of claim 4 wherein said azole is benzotriazole.

* * * * *